United States Patent [19]

Rimsa et al.

[11] Patent Number: 4,550,140
[45] Date of Patent: Oct. 29, 1985

[54] CIRCUIT BOARD SUBSTRATES PREPARED FROM POLY(ARYL ETHERS)S

[75] Inventors: Stephen B. Rimsa, Lebanon; James E. Harris; Herbert S. Chao, both of Piscataway; Louis M. Maresca, Belle Mead, all of N.J.

[73] Assignee: Union Carbide Corporation, Danbury, Conn.

[21] Appl. No.: 591,545

[22] Filed: Mar. 20, 1984

[51] Int. Cl.$^4$ .............................................. C08G 65/40
[52] U.S. Cl. ................................... 525/132; 428/901; 524/424; 524/425; 524/445; 524/449; 524/451; 524/495; 524/609; 524/611; 525/150; 525/434; 525/436; 525/437; 525/462; 528/125; 528/126; 528/128; 528/174
[58] Field of Search .............. 528/125, 126, 128, 174; 525/132, 150, 434, 436, 437, 462; 524/609, 611, 451, 449, 445, 425, 424, 495; 428/901

[56] References Cited

U.S. PATENT DOCUMENTS

| | | | |
|---|---|---|---|
| 4,008,203 | 2/1977 | Jones | 528/174 |
| 4,105,635 | 8/1978 | Freeman | 528/174 |
| 4,108,837 | 8/1978 | Johnson et al. | 528/174 |
| 4,175,175 | 11/1979 | Jonnson et al. | 528/125 |
| 4,200,728 | 4/1980 | Blinne et al. | 528/174 |
| 4,208,508 | 6/1980 | Hashino et al. | 528/174 |
| 4,339,568 | 7/1982 | Maresca | 528/126 |
| 4,473,684 | 9/1984 | Maresca et al. | 528/174 |

OTHER PUBLICATIONS

R. N. Johnson, "Polysulfones" in the *Encyclopedia of Polymer Science and Technology*, vol. 11, (John Wiley & Sons, Inc. 1969).

*Primary Examiner*—Lester L. Lee
*Attorney, Agent, or Firm*—Donald M. Papuga

[57] ABSTRACT

Circuit board substrates prepared from poly(aryl ether)s which contain repeating units derived from bis-(3,5-dimethyl-4-hydroxyphenyl) sulfone (TMBS) exhibit adequate glass transition temperatures (Tg), acceptable plateability and acceptable resistance to water absorption.

18 Claims, No Drawings

CIRCUIT BOARD SUBSTRATES PREPARED FROM POLY(ARYL ETHERS)S

BRIEF SUMMARY OF THE INVENTION

1. Technical Field

This invention relates to circuit boards prepared from poly(aryl ether)s which contain bis-(3,5-dimethyl-4-oxyphenyl)sulfone as a structural unit.

2. Background of the Invention

Circuit boards are widely used in the electrical industry for radio, television, computers, appliances, industrial and electronic equipment. Printed circuit boards have been traditionally manufactured from a copper clad epoxy-glass laminate. When starting with this material, the shape of the printed circuit board must first be routed out and the holes for mounting the components (e.g., transistors, resistors, integrated circuits, etc.) individually drilled. The board is then masked with photoresist, the circuitry imaged, and the copper etched away from areas where it is not wanted.

Another procedure for manufacturing printed circuit boards involves injection molding the circuit board substrate with the holes in place. The molded substrate is then put through several adhesion promotion steps and plated with electroless copper according to standard technology, to produce the printed circuit board. In this injection molding procedure, the substrate material is limited to thermoplastic resins with sufficient thermal stability and chemical properties to survive wave soldering. Also, savings may result with these injection molded circuit board substrates due to the elimination of considerable mechanical processing such as routing and drilling.

The critical parameters of a printed circuit board, from a soldering standpoint, are its glass transition temperature (Tg), environmental stress crack resistance and thermal expansion coefficient. The higher a substrate's glass transition temperature (Tg) and environmental stress crack resistance to solder fluxes, the less likely it will blister or delaminate during soldering.

Other parameters of a printed circuit board are its plateability and resistance to water absorption. Acceptable plateability requires good adhesion of electrolessly plated copper to the circuit board substrate. Acceptable resistance to water absorption requires little or no water assimilation into the circuit board substrate so as to provide good electrical properties.

Poly(aryl ether)s containing the following repeat units:

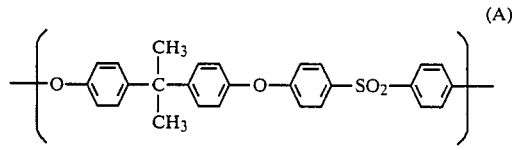

(A)

or

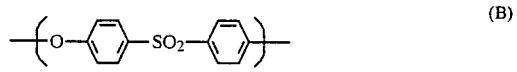

(B)

are commercially available thermplastic polymers which have a wide variety of end-use applications. These thermoplastic polymers are described in, for example, U.S. Pat. Nos. 4,175,175 (formula A) and 4,008,203 (formula B). Such end-use applications include the use of these thermoplastic polymers for injection molding into circuit board substrates. However, a circuit board substrate molded from the poly(aryl ether) of formula (A) has a glass transition temperature (Tg) which is generally not as high as desired for soldering temperatures such as those encountered in wave soldering. Circuit boards molded from the poly(aryl ether) of formula (B) have an acceptable glass transition temperature (Tg) but do not have, in some instances, acceptable plateability and resistance to water absorption.

U.S. patent application Ser. No. 516,863, filed July 25, 1983, describes a blend composition useful for making circuit board substrates and electrical connectors containing from 40 to 90 weight percent of a poly(ether sulfone), i.e, such as that of formula (B) above, and from 10 to 60 weight percent of a polysulfone, i.e., such as that of formula (A) above. A circuit board substrate molded from the blend composition is stated to have improved plateability.

U.S. patent application Ser. No. 448,376, filed Dec. 9, 1982, describes a blend composition useful for making circuit board substrates and electrical connectors containing a poly(aryl ether), i.e., such as that of formulas (A) or (B) above, a poly(etherimide), a fiber and a filler. A circuit board substrate molded from the blended composition is stated to have improved plateability.

U.S. patent application Ser. No. 566,298, filed Dec. 28, 1983, describes select polyarylethersulfone polymers useful for molding into a circuit board substrate. Incorporation of specified amounts of hydroquinone in the synthesis of a polymer such as that of formula (B) above, produces a polyarylethersulfone which is suitable for being molded into circuit board substrates. When metal is electroplated onto such circuit board substrates, it is stated that there is a high degree of adhesion of the metal to the circuit board substrate.

DISCLOSURE OF THE INVENTION

It has been found as a result of this invention that acceptable circuit board substrates can be prepared from a composition comprising a poly(aryl ether) containing recurring units of the following formula:

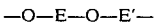

wherein E is the residuum of a dihydric phenol which contains repeating units derived from bis-(3,5-dimethyl-4-hydroxyphenyl)sulfone (TMBS), E' is the residuum of a benzenoid compound, and wherein the poly(aryl ether) has a reduced viscosity of at least about 0.3 dl/g as measured in N-methylpyrrolidinone at a concentration of 0.5 g/100 ml at 25° C. Circuit board substrates molded from these poly(aryl ether)s containing repeating units of bis-(3,5-dimethyl-4-oxyphenyl)sulfone have desirable properties including an adequate glass transition temperature (Tg) and acceptable plateability and resistance to water absorption.

DETAILED DESCRIPTION

The preferred poly(aryl ether)s utilized in manufacturing the circuit board substrates of this invention are more particularly described in U.S. patent application Ser. No. 485,948, filed Apr. 18, 1983.

The poly(aryl ether)s may be described as linear, thermoplastic poly(aryl ether)s. They are generally prepared by reacting a dihydroxyphenol with an activated dihalo-substituted aromatic compound. The essential feature of the poly(aryl ether)s is the requirement that the polymer chain contains repeating units derived from bis-(3,5-dimethyl-4-hydroxyphenyl)sulfone (TMBS). This results in a polymer which contains repeating monomeric units that may be characterized as bis-(3,5-dimethyl-4-oxyphenyl)sulfone units. The concentration of the bis-(3,5-dimethyl-4-oxyphenyl)sulfone repeating monomeric units in the poly(aryl ether)s is not narrowly critical and can be varied over a wide range. In particular, the poly(aryl ether)s utilized in manufacturing the circuit board substrates of this invention contain at least about 20 weight percent, preferably about 50 weight percent, more preferably about 75 weight percent and most preferably about 90 weight percent of bis-(3,5-dimethyl-4-oxyphenyl)sulfone units incorporated therein. In general, those poly(aryl ether)s containing the greater weight percentages of bis-(3,5-dimethyl-4-oxyphenyl)sulfone repeating units will preferably have the more desirable properties for circuit board applications.

Specifically, the poly(aryl ether)s utilized in manufacturing the circuit board substrates of this invention contain recurring units of the following formula:

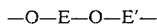

wherein E is the residuum of a dihydric phenol which contains repeating units (I) having the formula:

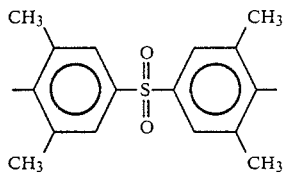

and optionally repeating units (II) having the formula

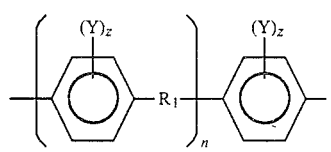

wherein Y is selected from alkyl groups of 1 to 4 carbon atoms, chlorine or bromine, each z, independently, has a value of from 0 to 4 inclusive, n has a value of 0 or 1, and $R_1$ is a divalent saturated or unsaturated aliphatic hydrocarbon radical, particularly an alkylene or alkylidene radical having from 1 to 6 carbon atoms or a cycloalkylidene or cycloalkylene radical having up to and including 9 carbon atoms, O, CO, $SO_2$, S or a direct bond, with the proviso that when $R_1$ is $SO_2$ then repeating unit (II) is not the same as repeating unit (I), E' is the residuum of a benzenoid compound having an inert electron withdrawing group in at least one of the positions ortho and para to the valence bonds; both of said residua are valently bonded to the ether oxygens through aromatic carbon atoms, and wherein the poly(aryl ether) has a reduced viscosity of at least about 0.3 dl/g as measured in chloroform at a concentration of 0.5 g/100 ml at 25° C.

The diphenol reactant bis-(3,5-dimethyl-4-hydroxyphenyl)sulfone (TMBS) which gives repeating units (I) hereinabove can be prepared according to the process described in U.S. Pat. No. 3,383,421.

Suitable bisphenol compounds which give repeating units (II) having the formula described above, in addition to 2,2-bis-(4-hydroxyphenyl)propane (Bisphenol A) and bis-(4-hydroxyphenyl)sulfone, include bis-(4-hydroxyphenyl)methane, 2,2-bis(4-hydroxy-3-methylphenyl)propane, 4,4-bis-(4-hydroxyphenyl)heptane, 2,2-bis-(3,5-dichloro-4-hydroxyphenyl)propane, 2,2-bis-(3,5-dibromo-4-hydroxyphenyl)propane, and bis-(3-chloro-4-hydroxyphenyl)methane. Other bisphenol compounds are also available and are disclosed in U.S. Pat. Nos. 2,999,835, 3,028,365 and 3,334,154.

As herein used, the E term defined as being the "residuum of the dihydric phenol" of course refers to the residue of the dihydric phenol after the removal of the two aromatic hydroxyl groups. Thus, as is readily seen, these poly(aryl ether)s contain recurring groups of the residuum of the dihydric phenol and the residuum of the benzenoid compound bonded through aromatic ether oxygen atom.

Any dihalobenzenoid or dinitrobenzenoid compound or mixtures thereof can be employed in preparing the poly(aryl ether)s which compound or compounds has the two halogens or nitro-groups bonded to benzene rings having an electron withdrawing group in at least one of the positions ortho and para to the halogen or nitro-group. The dihalobenzenoid or dinitrobenzenoid compound can be either mononuclear where the halogens or nitro groups are attached to the same benzenoid rings or polynuclear where they are attached to different benzenoid rings, as long as there is an activating electron withdrawing group in the ortho or para position of that benzenoid nucleus. Fluorine, chlorine and nitro substituted benzenoid reactants are preferred; the fluorine and nitro compounds for fast reactivity and the chlorine compounds for their inexpensiveness.

An electron withdrawing group can be employed as the activator group in these compounds. It should be, of course, inert under the reaction conditions, but otherwise its structure is not critical. Preferred are the strong activating groups such as the sulfone group

bonding two halogen or nitro substituted benzenoid nuclei as in the 4,4'-dichlorodiphenyl sulfone and 4,4'-difluorodiphenyl sulfone, although such other strong withdrawing groups can also be used with equal ease.

Exemplary of suitable benzenoid compounds are the 4,4'-dihalo-substituted aromatic sulfones or benzophenones such as 4,4'-dichlorodiphenyl sulfone, 4,4'-difluorodiphenyl sulfone, 4,4'-dichlorobenzophenone or 4,4'-difluorobenzophenone. An optional feature is the substitution of a portion of the TMBS monomer with other dihydric phenols such as Bisphenol-A, bis-(4-hydroxyphenyl)sulfone, hydroquinone or 4,4'-biphenol.

The poly(aryl ether)s utilized in manufacturing the circuit board substrates of this invention are formed by the reaction of the specified dihydric phenols with the specific dihalo-substituted aromatic compounds in an anhydrous dipolar aprotic solvent in the presence of a strong base. Specifically the polymers are prepared by the substantially equimolar one-step reaction of a double alkali metal salt of dihydric phenol with a dihalobenzenoid compound in the presence of specific liquid organic sulfoxide, sulfone or amide solvents under substantially anhydrous conditions. Catalysts are not necessary for this reaction.

The poly(aryl ether)s may also be prepared in a two-step process in which a dihydric phenol is first converted in situ in the primary reaction solvent to the alkali metal salt with an alkali metal, an alkali metal hydride, alkali metal hydroxide, alkali metal alkoxide or an alkali metal alkyl compound. Preferably, an alkali metal hydroxide is employed. After removing the water which is present or formed, in order to secure substantially anhydrous conditions, the dialkali metal salts of the dihydric phenol are admixed and reacted with about stoichiometric quantities of the dihalobenzenoid or dinitrobenzenoid compound.

Additionally, the poly(aryl ether)s may be prepared by the procedure described in, for example, U.S. Pat. No. 4,176,222 in which a substantially equimolar mixture of at least one bisphenol and at least one dihalobenzenoid are heated at a temperature of from about 100° C. to about 400° C. with a mixture of sodium carbonate or bicarbonate and a second alkali metal carbonate or bicarbonate having a higher atomic number than that of sodium.

Further, the poly(aryl ether)s may be prepared by the procedure described in Canadian Pat. No. 847,963 wherein the bisphenol and dihalobenzenoid compound are heated in the presence of potassium carbonate using a high boiling solvent such as diphenylsulfone.

The polymerization reaction is performed under substantially anhydrous conditions so as to avoid side reactions that can be caused by the presence of water. Procedures for removing water from such a system are well known in the art and include treatment with a dehydrating agent such as a mineral salt that will take up the water or azeotropic techniques that will remove water from the reaction medium as an azeotrope. Alternatively the water can be sparged from the reaction media using an inert gas sparge (e.g., nitrogen).

U.S. Pat. No. 4,339,568 describes azeotroping techniques that are useful to ensure that the reaction medium remains substantially anhydrous. An organic solvent is chosen as an azeotroping co-solvent with the dipolar aprotic solvent. This azeotroping co-solvent is one which is inert to the polymerizing reactants, but will form an azeotrope with water. The azeotroping co-solvent is added to the reaction medium and is then continuously removed from the reaction medium by volatilizing the solvent as an azeotrope with water. Examples of suitable azeotroping co-solvents include aromatic hydrocarbons such as benzene, toluene, xylene and ethylbenzene and haloaromatics such as chlorobenzene and o-dichlorobenzene.

The dipolar aprotic solvents useful in the process of the instant invention are well known in the art. Exemplary of such solvents are dimethylsulfoxide (DMS), dimethylformamide (DMF), dimethylacetamide (DMAC), N-methyl-2-pyrrolidone (NMP), diphenyl sulfone and sulfolane all of which will serve to dissolve the reactants in a nonaqueous liquid medium. The temperature at which the reaction medium is maintained is not narrowly critical, however, it is desirable to keep the reaction medium at a temperature at which all of the reactants dissolve in the solvent chosen for the reaction medium.

It is generally desirable to add a chain stopper to the reaction mixture when the desired degree of polymerization has been achieved. These chain stoppers are molecules which have only one site that is reactive in the polymerization reaction such that the chain stopper molecule becomes the terminal unit of the polymer. Examples of such chain stoppers include activated mono-halo-aromatic compounds, such as monochlorodiphenyl sulfone and monochlorobenzophenone, and simple monohalo-aliphatic compounds, also known as alkyl halides, such as methyl chloride. Compounds such as benzyl chloride, which is an aryl-substituted alkyl halide are also suitable chain stoppers. The addition of these compounds to the reaction mixture will serve to terminate the polymerization reaction and to stabilize the resulting polymer at the desired degree of polymerization.

The molecular weight of the poly(aryl ether)s utilized in manufacturing the circuit board substrates of this invention is indicated by reduced viscosity data in the indicated solvents. As well understood in the art, the viscosity of a resin solution bears a direct relationship to the weight average molecular size of the polymer chains, and is typically the most important single property that can be used to characterize the degree of polymerization. The reduced viscosity assigned to the poly(aryl ether)s is therefore to be understood as significant in reflecting molecular weight rather than consideration concerning the viscosity per se. Most of these poly(aryl ether) polymers are readily soluble in N-methylpyrrolidinone, chloroform, or tetrachloroethane or other similar solvents.

Reduced viscosity (R.V.) as used in the examples herein was determined by dissolving a 0.2 or 0.5 gram sample of poly(aryl ether) polymer in the indicated solvent contained in a 100 milliliter volumetric flask so that the resultant solution measured exactly 100 milliliters at 25° C. in a constant temperature bath. The viscosity of 3 milliliters of the solution which had been filtered through a sintered glass funnel was determined in an Ostwald or similar type viscometer at 25° C. Reduced viscosity values were obtained from the equation:

$$\text{Reduced Viscosity} = \frac{t_s - t_o}{C \cdot t_o}$$

wherein:
 $t_o$ is the efflux time of the pure solvent;
 $t_s$ is the efflux time of the polymer solution; and
 C is the concentration of the polymer solution expressed in terms of grams of polymer per 100 milliliters of solution.

The poly(aryl ether)s utilized in manufacturing the circuit board substrates of this invention are characterized as linear thermoplastic structures which have a relatively high molecular weight, that is, a reduced viscosity determined at a concentration of 0.5 g/100 ml in N-methylpyrrolidinone at 25° C. of at least 0.3 dl/g, preferably at least 0.5 dl/g and, typically not exceeding about 1.5 dl/g. These polymers provide highly desirable properties to circuit boards prepared therefrom. Circuit board substrates molded from these poly(aryl ether)s have an adequate glass transition temperature (Tg), acceptable plateability and acceptable resistance to water absorption.

The procedures described in U.S. Pat. No. 4,339,568 and U.S. Pat. No. 4,175,175 are especially useful to prepare the poly(aryl ether)s utilized in manufacturing the circuit board substrates of the instant invention. The disclosure of those patents is therefore incorporated herein by reference.

The poly(aryl ether)s utilized in manufacturing the circuit board substrates of this invention exhibit compatibility with other polymers such as those which are described in U.S. Pat. No. 3,264,536 and U.S. Pat. No. 4,175,175, as well as with other polycarbonates, poly(ester-carbonate)s, polyesters, polyarylates, poly(ether imide)s, sytrenic polymers, vinyl chloride containing polymers and the like. Such blends exhibiting mechanical compatibility may be useful in manufacturing the circuit board substrates of this invention. Mechanical compatibility refers to a balance of mechanical properties, e.g., strength, toughness and the like, in miscible blend systems which is generally an average of the mechanical properties of the particular blend constituents. The moldable and compatible blends may typically contain from about 5 weight percent to about 95 weight percent of the poly(aryl ether)s employed in the circuit boards of this invention and from about 95 weight percent to about 5 weight percent of a polymer exhibiting mechanical compatibility with the poly(aryl ether). The weight percent ratio of the polymers may vary widely depending upon the properties sought from the molded products made from the blend.

The poly(aryl ether)s utilized in manufacturing the circuit board substrates of this invention may be optionally used with other ingredients such as stabilizers, i.e., metal oxides such as zinc oxide, antioxidants, flame retardants, pigments, and the like. The poly(aryl ether)s may be optionally used with reinforcing fibers and/or inorganic fillers. The reinforcing fiber includes fiberglass, carbon fibers, and the like, and mixtures thereof. The carbon fibers include those having a high Young's modulus of elasticity and high tensile strength. These carbon fibers may be produced from pitch, as described in U.S. Pat. Nos. 3,976,729; 4,005,183 and 4,026,788, for example. The particulate inorganic fillers which may be used include wollastonite, calcium carbonate, glass beads, talc, mica, clay, quartz and the like, or mixtures thereof.

The fiber reinforcement, filler or combinations thereof, can be utilized in amounts of from 0 to about 50 weight percent, preferably from about 10 to about 35 weight percent, of the total weight of the circuit board substrate.

The poly(aryl ether)s in combination with other ingredients can be prepared by any conventional mixing methods. For example, the poly(aryl ether)s and other optional ingredients in powder or granular form can be blended in an extruder and the mixture can be extruded into strands and the strands can be chopped into pellets. The pellets can then be molded into the desired circuit board substrate by conventional techniques.

The poly(aryl ether)s can be molded into circuit board substrates using conventional techniques such as injection molding. Specifically, the composition can be molded into circuit board substrates using conventional molding equipment. The molded boards are then swelled and etched to promote the adhesion of copper by both roughening the surface and introducing chemical moieties through oxidation. The circuitry is then applied to the board by either a conventional additive or a semiadditive process. In either case copper is applied to the substrate in an electroless manner after the application of catalysts which activate the surface to the deposition of metal in a conventional manner.

As used in this invention, the glass transition temperature (Tg) of the polymers herein has a direct correlation with the heat distortion temperature of the polymers. In general, the heat distortion temperature of the polymers is typically 10° C. to 20° C. below the glass transition temperature (Tg) of the amorphous polymers.

Although this invention has been described with respect to a number of details, it is not intended that this invention should be limited thereby. The examples which follow are intended solely to illustrate the embodiments of this invention which to date have been determined and are not intended in any way to limit the scope and intent of this invention.

The glass transition temperature (Tg) of the polymers prepared in the examples was measured by the resilience minimum technique using modulus-temperature data and resilience-temperature data as described in O. Olabisi et al., "Polymer-Polymer Miscibility", Academic Press, New York, 1979, pages 122–126.

EXAMPLE 1

Into a two liter four-necked round bottom reaction flask equipped with a nitrogen inlet and outlet, a mechanical stirrer, a distillate trap, a thermocouple and a condenser was charged 53.62 grams (0.175 moles) of bis-(3,5-dimethyl-4-hydroxyphenyl)sulfone (TMBS), 74.19 grams (0.325 moles) of 2,2-bis-(4-hydroxyphenyl)-propane (Bisphenol A), and 400 milliliters of monochlorobenzene. The contents in the reaction flask were heated under nitrogen to a temperature of 100° C. with continuous stirring, after which 126.1 grams (1.0 moles, 44.49%) of aqueous potassium hydroxide was added dropwise followed by the addition of 435 milliliters of sulfolane which caused precipitation of the potassium salts of the diphenols. The contents in the reaction flask were then heated to reflux and the water was removed as an azeotrope with monochlorobenzene. The water was completely removed after 4 hours at 160° C., and the contents in the reaction flask were then cooled to a temperature of 150° C. Into the reaction flask was then added 143.59 grams (0.5 moles) of 4,4'-dichlorodiphenylsulfone as a 50 percent solution in monochlorobenzene. After this addition was complete, the contents in the reaction flask were heated under nitrogen to a temperature of 230°–240° C. with continuous stirring for a period of 6 hours. The contents in the reaction flask were then cooled and the resulting polymer was isolated by coagulation in water. The polymer was washed with water and then dried in a vacuum oven at 100° C. The polymer had a reduced viscosity of 0.46 dl/g as measured in N-methyl-2-pyrrolidinone (0.2 g/100 ml) and had a glass transition temperature (Tg) of 205° C.

EXAMPLE 2

Into a 500 milliliter flask equipped with a nitrogen inlet and outlet, a mechanical stirrer, a distillate trap, a thermocouple and a condenser was charged 45.96 grams (0.15 moles) of bis-(3,5-dimethyl-4-hydroxyphenyl)sulfone (TMBS), 43.08 grams (0.15 moles) of 4,4'-dichlorodiphenyl sulfone, 21.86 grams (0.155 moles) of potassium carbonate, 182.20 grams of sulfolane and 50 milliliters of chlorobenzene. The reaction mixture was heated under nitrogen to 225° C. In the process of heating, chlorobenzene was distilled along with water formed in the reaction. After 12 hours at 225° C., the reaction mixture was cooled and the polymer isolated by coagulation in water. The polymer was washed with water and then dried in a vacuum oven at 100° C. The polymer had a reduced viscosity of 0.64 dl/g as measured in N-methyl-2-pyrrolidinone (0.2 g/100 ml) and had a glass transition temperature (Tg) of 265° C.

COMPARATIVE EXAMPLE A

A polyarylene polyether of formula (A) hereinabove and commercially designated as UDEL P-1700 was obtained from Union Carbide Corporation, Danbury, Conn. UDEL P-1700 was prepared from 2,2-bis-(4-hydroxyphenyl)propane (Bisphenol A) and 4-4'-dichlorodiphenylsulfone in a manner similar to Example 1 of U.S. Pat. No. 4,108,837. The polymer had a reduced viscosity of 0.51 dl/g as measured in chloroform (0.2 g/100 ml) and and a glass transition temperature (Tg) of 180° C. This glass transition temperature (Tg) is too low for soldering temperatures used for circuit boards such as those encountered in wave soldering.

The peel strength of the polymers prepared in the following examples was determined as follows:

A sample of the polymer was compression molded into a plaque in a 4 inch×4 inch×0.125 inch cavity mold at about 300° C. using a South Bend hydraulic press with heated platens. The resultant molded plaques were immersed in an aqueous solution containing 30% concentration by volume of 1,3-dichloro-2-propanol for 90 seconds at 100° F. This constituted the pre-etch. The plaques were then rinsed (5 min @ 30° C.) and immersed in an etch which was a chromic acid solution of the following composition:

96% $H_2SO_4$—55.9 weight %
87% $H_3PO_4$—10.4 weight %
$CrO_3$—3.0 weight %
$H_2O$—30.7 weight %

Etching was accomplished in 10 minutes at 158° F. Following treatment, the surface of the plaque was made catalytic to a conventional electroless copper solution by immersion in a solution containing stannous chloride and palladium chloride. The plaques were then immersed in the autocatalytic electroless copper solution containing a chelating agent for cupric ion, a pH regulator and a reducing agent for cupric ion. After a thin copper coat appeared on the plaque, the plaque was electroplated to a thickness of about 2 mils. Following electroplating, the specimens were allowed to equilibrate for 72 hours in a vacuum oven at 120° F. Electroplate adhesion was then evaluated by the peel strength test. The peel strength in pounds per inch was determined by pulling a one-inch wide strip of metal from the plaque at a rate of 0.2 inches per minute and an angle of 90° using an Instron Universal Testing Machine.

The water absorption of the polymers prepared in the following examples was determined in accordance with ASTM D 570-81.

EXAMPLE 3

The poly(aryl ether) containing the residuum bis-(3,5-dimethyl-4-hydroxyphenyl)sulfone (TMBS) prepared in Example 1 hereinabove was determined to have a peel strength of 4.5 pounds per inch for copper plated substrates and a water absorption of 0.35 percent.

COMPARATIVE EXAMPLE B

Poly(ether sulfone) of formula (B) hereinabove commercially available from Imperial Chemical Industries Limited, Great Britain, and designated as VICTREX ® PES which is prepared from 4,4'-dichlorodiphenylsulfone and the unsubstituted 4,4'-dihydroxydiphenylsulfone and which does not contain the residuum of bis-(3,5-dimethyl-4-hydroxyphenyl)sulfone was determined to have a peel strength of 2.4 pounds per inch for copper plated substrates and a water absorption of 0.43 percent.

COMPARATIVE EXAMPLE C

The polyarylene polyether described in Comparative Example A hereinabove did not exhibit plating under the described conditions.

From the experimental data hereinabove, a poly(aryl ether) containing repeating units derived from bis-(3,5-dimethyl-4-hydroxyphenyl)sulfone (TMBS) in accordance with the poly(aryl ether)s utilized in the circuit board substrates of this invention exhibits significantly greater peel strength for copper plated substrates and significantly lower water absorption than a comparable poly(aryl ether) which does not contain repeating units derived from TMBS.

We claim:

1. A circuit board substrate molded from a composition comprising a poly(aryl ether) containing recurring units of the following formula:

—O—E—O—E'— wherein E is the residuum of a dihydric phenol which contains repeating units derived from bis-(3,5-dimethyl-4-hydroxyphenyl)sulfone, E' is the residuum of a benzenoid compound, and wherein the poly(aryl ether) has a reduced viscosity of at least about 0.3 dl/g as measured in N-methylpyrrolidinone at a concentration of 0.2 g/100 ml at 25° C.

2. A circuit board substrate as defined in claim 1 wherein E is the residuum of a dihydric phenol which contains repeating units (I) having the formula

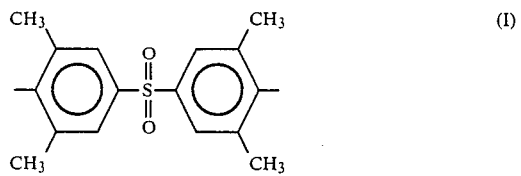

and optionally repeating units (II) having the formula

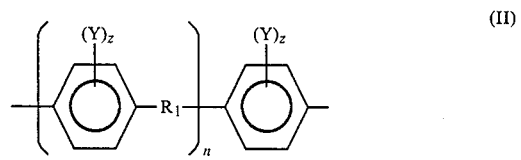

wherein Y is selected from alkyl groups of 1 to 4 carbon atoms, chlorine or bromine, each z, independently, has a value of from 0 to 4 inclusive, n has a value of 0 or 1, and $R_1$ is a divalent saturated or unsaturated aliphatic hydrocarbon radical, O, CO, $SO_2$, S or a direct bond, with the proviso that when $R_1$ is $SO_2$ then repeating unit (II) is not the same as repeating unit (I).

3. A circuit board substrate as defined in claim 2 wherein repeating unit (II) is the residuum of bisphenol A.

4. A circuit board substrate as defined in claim 2 wherein repeating unit (II) is the residuum of hydroquinone.

5. A circuit board substrate as defined in claim 2 wherein repeating unit (II) is the residuum of bis-(4-hydroxyphenyl)sulfone.

6. A circuit board substrate as defined in claim 2 wherein repeating unit (II) is the residuum of 4,4'-bisphenol.

7. A circuit board substrate as defined in claim 2 wherein E contains at least about 20 weight percent of repeating units (I).

8. A circuit board substrate as defined in claim 1 wherein E' is the residuum of a benzenoid compound having an inert electron withdrawing group in at least one of the positions ortho or para to the valence bonds.

9. A circuit board substrate as defined in claim 1 wherein E' is the residuum of 4,4'-dichlorodiphenyl sulfone.

10. A circuit board substrate as defined in claim 1 wherein E' is the residuum of 4,4'-difluorobenzophenone.

11. A circuit board substrate as defined in claim 1 wherein E' is the residuum of 4,4'-difluorodiphenyl sulfone.

12. A circuit board substrate as defined in claim 1 wherein E' is the residuum of 4,4'-dichlorobenzophenone.

13. A circuit board substrate as defined in claim 1 wherein the composition contains from about 5 to about 95 weight percent of a polymer having mechanical compatibility with the poly(aryl ether).

14. A circuit board substrate as defined in claim 13 wherein the polymer is selected from a polycarbonate, a poly(ester carbonate), a polyester, a polyarylate, a poly(ether imide), a styrenic polymer and a vinyl chloride containing polymer.

15. A circuit board substrate as defined in claim 1 wherein the composition contains up to about 50 weight percent of a mineral filler.

16. A circuit board substrate as defined in claim 15 wherein the mineral filler is selected from wollastonite, calcium carbonate, glass beads, talc, mica, clay and quartz.

17. A circuit board substrate as defined in claim 1 wherein the composition contains up to about 50 weight percent of a reinforcing fiber.

18. A circuit board substrate as defined in claim 17 wherein the reinforcing fiber is selected from fiberglass and carbon fibers.

* * * * *